United States Patent
Cho

(10) Patent No.: US 9,553,074 B2
(45) Date of Patent: Jan. 24, 2017

(54) SEMICONDUCTOR PACKAGE HAVING CASCADED CHIP STACK

(71) Applicant: Samsung Electronics Co., Ltd., Suwon-si, Gyeonggi-do (KR)

(72) Inventor: Yun-Rae Cho, Suwon-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 14/732,660

(22) Filed: Jun. 5, 2015

(65) Prior Publication Data

US 2016/0086921 A1    Mar. 24, 2016

(30) Foreign Application Priority Data

Sep. 19, 2014    (KR) .................. 10-2014-0125233

(51) Int. Cl.
*H01L 23/40*    (2006.01)
*H01L 25/11*    (2006.01)
(Continued)

(52) U.S. Cl.
CPC ....... *H01L 25/0657* (2013.01); *H01L 23/4012* (2013.01); *H01L 23/49838* (2013.01); *H01L 24/17* (2013.01); *H01L 24/49* (2013.01); *H01L 24/92* (2013.01); *H01L 25/50* (2013.01); *H01L 23/3128* (2013.01); *H01L 24/16* (2013.01); *H01L 24/29* (2013.01); *H01L 24/32* (2013.01); *H01L 24/48* (2013.01); *H01L 24/73* (2013.01);
(Continued)

(58) Field of Classification Search
CPC .. H01L 25/0657; H01L 25/043; H01L 25/074; H01L 25/117; H01L 25/50; H01L 24/17; H01L 24/49; H01L 24/73; H01L 24/15; H01L 24/16; H01L 24/19; H01L 24/32; H01L 24/48; H01L 24/91; H01L 24/92; H01L 23/49838; H01L 23/3128; H01L 2225/06513; H01L 2225/06562; H01L 2225/06551; H01L 2225/06568; H01L 2224/73207; H01L 2224/16148; H01L 2224/48227; H01L 2224/92242; H01L 2224/04042; H01L 2224/06145; H01L 2224/49175; H01L 2224/73265; H01L 2924/14; H01L 2924/1436; H01L 2924/1438; H01L 2924/1531; H01L 2224/05569
See application file for complete search history.

(56) References Cited

U.S. PATENT DOCUMENTS 7,859,098 B2    12/2010    Ong et al.
7,906,852 B2 *    3/2011    Nishimura ............. H01L 24/13
                                                                257/686
(Continued)

FOREIGN PATENT DOCUMENTS

KR    101239458 B1    3/2013
KR    20140027799 A    3/2014

*Primary Examiner* — Galina Yushina
(74) *Attorney, Agent, or Firm* — Renaissance IP Law Group LLP

(57) ABSTRACT

A semiconductor package that includes a package substrate, a lower semiconductor chip mounted on the package substrate, and an upper semiconductor chip stacked on the lower semiconductor chip in a cascade shape is provided. An active surface of the lower semiconductor chip is facing an active surface of the upper semiconductor chip.

15 Claims, 12 Drawing Sheets

(51) Int. Cl.
  *H01L 25/065* (2006.01)
  *H01L 23/00* (2006.01)
  *H01L 23/498* (2006.01)
  *H01L 25/00* (2006.01)
  *H01L 23/31* (2006.01)

(52) U.S. Cl.
  CPC .......... *H01L 2224/0401* (2013.01); *H01L 2224/04042* (2013.01); *H01L 2224/05554* (2013.01); *H01L 2224/05569* (2013.01); *H01L 2224/0603* (2013.01); *H01L 2224/06135* (2013.01); *H01L 2224/16145* (2013.01); *H01L 2224/16148* (2013.01); *H01L 2224/17181* (2013.01); *H01L 2224/2919* (2013.01); *H01L 2224/32225* (2013.01); *H01L 2224/48106* (2013.01); *H01L 2224/48227* (2013.01); *H01L 2224/49175* (2013.01); *H01L 2224/73207* (2013.01); *H01L 2224/73265* (2013.01); *H01L 2224/92163* (2013.01); *H01L 2224/92242* (2013.01); *H01L 2224/92247* (2013.01); *H01L 2225/0651* (2013.01); *H01L 2225/06513* (2013.01); *H01L 2225/06562* (2013.01); *H01L 2924/14* (2013.01); *H01L 2924/143* (2013.01); *H01L 2924/1434* (2013.01); *H01L 2924/1436* (2013.01); *H01L 2924/1438* (2013.01); *H01L 2924/15311* (2013.01)

(56) References Cited

U.S. PATENT DOCUMENTS

| | | | |
|---|---|---|---|
| 8,519,535 | B2 | 8/2013 | Lin et al. |
| 2007/0170575 | A1* | 7/2007 | Lee .......... H01L 24/73 257/686 |
| 2012/0086125 | A1* | 4/2012 | Kang .......... H01L 21/6835 257/738 |
| 2012/0300555 | A1* | 11/2012 | Shin .......... G11C 8/12 365/189.03 |
| 2013/0093103 | A1 | 4/2013 | Kim et al. |

* cited by examiner

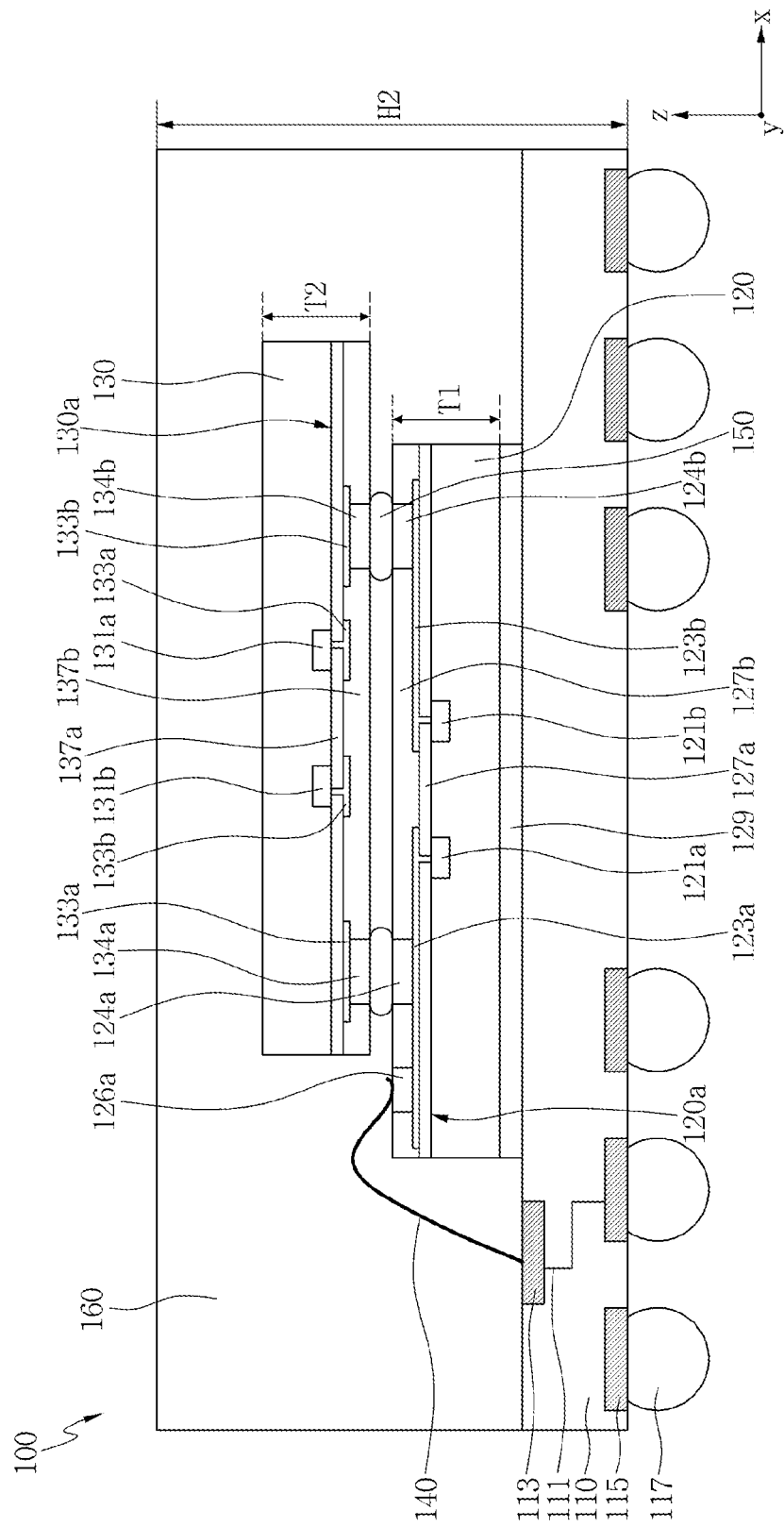

SEMICONDUCTOR PACKAGE HAVING CASCADED CHIP STACK

CROSS-REFERENCE TO RELATED APPLICATION

This application claims priority under 35 U.S.C. §119 to Korean Patent Application No. 10-2014-0125233 filed on Sep. 19, 2014, the disclosure of which is hereby incorporated by reference in its entirety.

BACKGROUND

Field

Embodiments of a semiconductor package having a cascaded chip stack are disclosed herein.

Description of Related Art

Recently, to increase an operational speed of mobile dynamic random access memory (DRAM) and to meet high capacity needs, a mirror die package (MDP) structure has been developed. Since a conventional MDP structure has a structure in which an upper semiconductor chip is bonded on a lower semiconductor chip in a flip chip bonding method, which is bonded to a substrate in a wire bonding method, a wire used in a wire bonding method is located between the lower semiconductor chip and the upper semiconductor chip. To this end, a distance between the lower semiconductor chip and the upper semiconductor chip should be constantly maintained.

Generally, the MDP structure requires a small mold thickness due to a characteristic of a package on package (PoP) structure. In order to satisfy the never ending demand for smaller chip packages, and as the distance between the lower semiconductor chip and the upper semiconductor chip should be constantly maintained, thicknesses of the lower semiconductor chip and the upper semiconductor chip should be reduced. Because of this, when the upper semiconductor chip is bonded on the lower semiconductor chip, it is easy to warp or damage the upper semiconductor chip. Thus, there is a need for improved bonding techniques between the upper semiconductor chip and the lower semiconductor chip in a a minor die package (MDP).

SUMMARY

A semiconductor package capable of preventing a bonding failure between semiconductor chips bonded in a flip chip bonding method while maintaining a small mold thickness is disclosed herein.

A method of manufacturing the semiconductor package is also disclosed.

Additionally, a module including the semiconductor package is provided.

Embodiments of electronic systems including the semiconductor package are introduced.

For example, a mobile wireless phone including the semiconductor package is disclosed.

The teachings herein are not limited to that which is recited herein; other aspects and objectives may become apparent to those of ordinary skill in the art based on the following descriptions.

In accordance with one embodiment, a semiconductor package includes a package substrate, a lower semiconductor chip mounted on the package substrate, and an upper semiconductor chip stacked on the lower semiconductor chip in a cascade shape. An active surface of the lower semiconductor chip may be facing an active surface of the upper semiconductor chip.

In accordance with another embodiment, a semiconductor package may include a package substrate including a first substrate wire pad, a lower semiconductor chip mounted on the package substrate, and an upper semiconductor chip stacked on the lower semiconductor chip in a cascade shape. The lower semiconductor chip may include a first lower chip input/output pad, a first lower redistribution layer, a first lower bump, and a first chip wire pad, which are electrically connected, and the upper semiconductor chip may include a first upper chip input/output pad, a first upper redistribution layer, and a first upper bump, which are electrically connected. The first chip wire pad of the lower semiconductor chip may be exposed without being covered by the upper semiconductor chip, the first chip wire pad of the lower semiconductor chip may bonded to the first substrate wire pad of the package substrate in a wire bonding method, and the first lower bump of the lower semiconductor chip may be bonded to the first upper bump of the upper semiconductor chip in a flip chip bonding method.

In accordance with still another embodiment, a semiconductor package may include a package substrate having a first substrate wire pad, wherein the first substrate wire pad may be disposed close to a first side of the package substrate, a lower semiconductor chip mounted on the package substrate, and an upper semiconductor chip stacked on the lower semiconductor chip in a cascade shape, wherein an active surface of the lower semiconductor chip may be facing an active surface of the upper semiconductor chip. The lower semiconductor chip may include a first lower chip input/output pad and a second lower chip input/output pad arranged in a central area on the active surface of the lower semiconductor chip, a first lower redistribution layer configured to extend from the first lower chip input/output pad to the first side on the package substrate, a first lower bump disposed on an intermediate part of the first lower redistribution layer, and a first chip wire pad disposed on an end part of the first lower redistribution layer. The upper semiconductor chip may include a first upper chip input/output pad and a second upper chip input/output pad disposed in a central area on the active surface of the upper semiconductor chip, a first upper redistribution layer configured to extend from the first upper chip input/output pad to the first side of the package substrate, and a first upper bump disposed on an end part of the first upper redistribution layer. The first lower bump and the first upper bump may be vertically aligned and bonded in a flip chip bonding method.

An electronic system includes a semiconductor package that includes a package substrate with a lower semiconductor chip mounted on the package substrate; and an upper semiconductor chip stacked on the lower semiconductor chip in a cascade shape, wherein an active surface of the lower semiconductor chip is facing an active surface of the upper semiconductor chip; and, at least one connection for transmitting power to the semiconductor package. The semiconductor package may include at least one of a memory, a microprocessor, and a controller. The semiconductor package may be configured for incorporation into at least one of a mobile device and a computer. The electronic system may include at least one of a mobile device, a communications device, a computer, an audio player, a navigation device, a solid-state disk (SSD), a desktop computer, an automobile, a household appliance, and a tablet computer.

Details of other embodiments are included in detailed explanations and the drawings.

BRIEF DESCRIPTION OF THE DRAWINGS

The foregoing and other features and advantages of the teachings disclosed herein will be apparent from the description provided and as illustrated in the accompanying drawings in which like reference characters refer to the same parts throughout the different views. The drawings are not necessarily to scale, emphasis instead being placed upon illustrating the various aspects that are described. In the drawings:

FIGS. 3A and 3B are schematic longitudinal sectional views showing the semiconductor packages taken along line I-I' of FIG. 1;

DETAILED DESCRIPTION OF THE EMBODIMENTS

Figure 1:
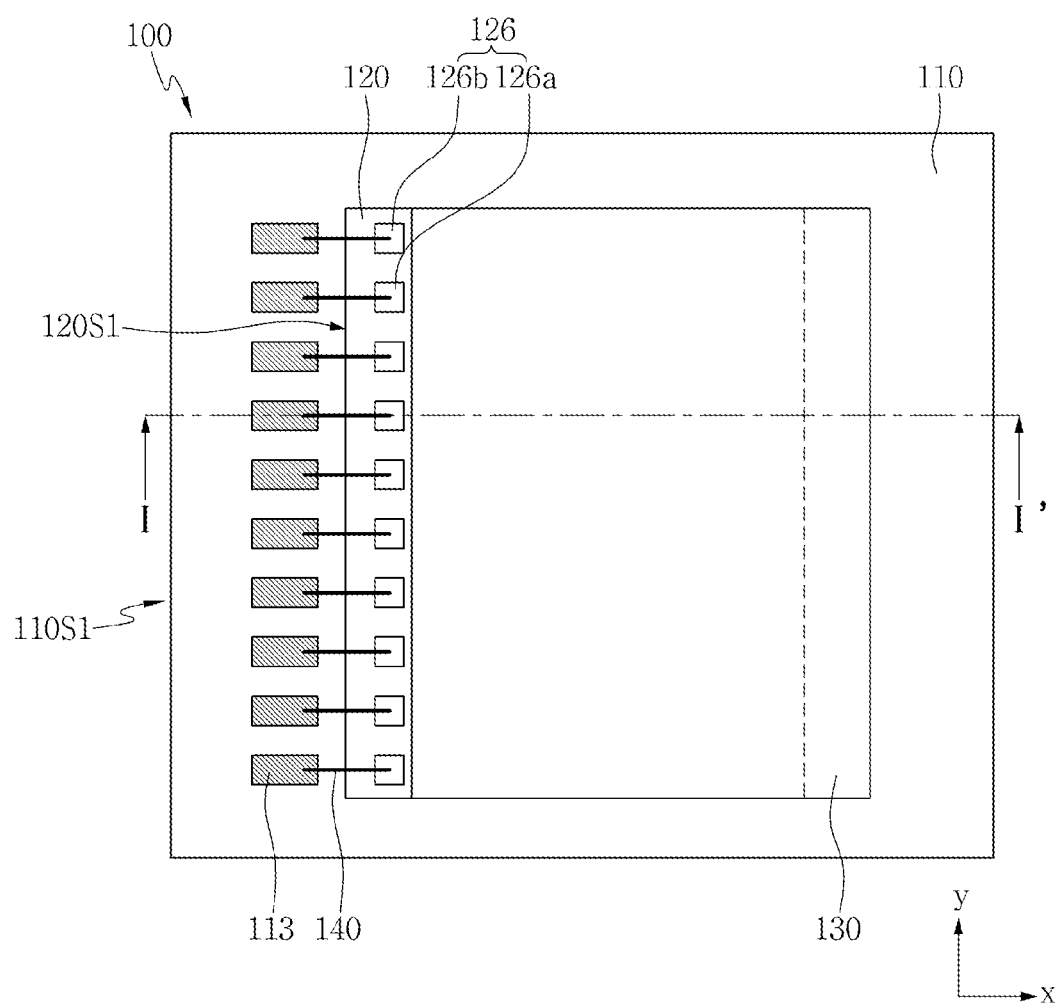
FIG. 1 is a schematic top view showing a semiconductor package according to the teachings herein.

Advantages and features of the technology disclosed and described herein and methods of accomplishing them will be made apparent with reference to the accompanying drawings and the embodiments to be described below. The concepts presented may, however, be embodied in various different forms, and should be construed as limited, not by the embodiments set forth herein, but only by the claims.

The terminology used herein is for the purpose of describing particular embodiments only and is not intended to be limiting of the present inventive concept. As used herein, the singular forms "a," "an," and "the" are intended to include the plural forms as well, unless the context clearly indicates otherwise. It will be further understood that the terms "comprises," and/or "comprising," when used in this specification, specify the presence of stated features, integers, steps, operations, elements, and/or components, but do not preclude the presence or addition of one or more other features, integers, steps, operations, elements, components, and/or groups thereof. The terms "has," "having" and "have" are open-ended and may include other elements beyond those recited.

As discussed herein, the term "exemplary" is not meant to imply a superlative. Rather, the term "exemplary" merely refers to one of many possible embodiments.

It will be understood that when an element is referred to as being "on," "connected to," or "coupled to" another element, the first element can be directly on, connected, or coupled to the other element. Other intervening elements may be present. In contrast, when an element is referred to as being "directly on," "directly connected to," or "directly coupled to" another element, there are no intervening elements. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed could be termed a second element, component, region, layer or section without departing from the teachings of the present disclosure.

Spatially relative terms, terms of orientation and the like, such as "beneath," "below," "lower," "above," "upper," and the like, may be used herein for ease of description in describing one element in relationship to another element or elements. Such elements may (or may only partially be) illustrated in the figures. It will be understood that spatially relative terms are intended to encompass different orientations than only those that are depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein may be interpreted accordingly.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from an implanted to non-implanted region. Thus, the regions illustrated in the figures are schematic in nature and their shapes are not intended to illustrate the actual shape of a region of a device and to limit the scope of the present inventive concept.

Like numbers refer to like elements throughout. Thus, the same or similar numbers may be described with reference to other drawings even if they are neither mentioned nor described in the corresponding drawing. Also, elements that are not denoted by reference numbers may be described with reference to other drawings.

The term "near" is intended to mean that one among two or more components is located within relatively close proximity of a certain other component. For example, it should be understood that when a first end is near a first side, the first end may be closer to the first side than a second end, or the first end may be closer to the first side than to a second side.

Various reference lines are included in the drawings. These are not to be construed as a part of the elements disclosed herein. Rather, reference lines and other devices may be used in the drawings and specification merely for purposes of convenience and to aid in an understanding of the technology disclosed herein.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but are to include deviations in shapes that result, for example, from manufacturing. For example, an implanted region illustrated as a rectangle may, generally, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. Where any dispute of terminology and definitions is concerned, interpretations should be considered as is most favorable to the technology disclosed herein.

The term "semiconductor chip" generally refers to electronic circuitry that is contained in a semiconductor component. Generally, each semiconductor chip includes a set of electronic circuits on a plate of semiconductor material such as silicon. In one example, a first chip includes a logic chip, such as a processor, while other chips may be memory chips connected that are then connected to the logic chip. A chip may include a variety of technologies, including, SSI, MSI, LSI, VLSI, WSI, SOC, 3D-IC and other technologies or forms as are known (or will be later devised) in the art.

Figure 3A:
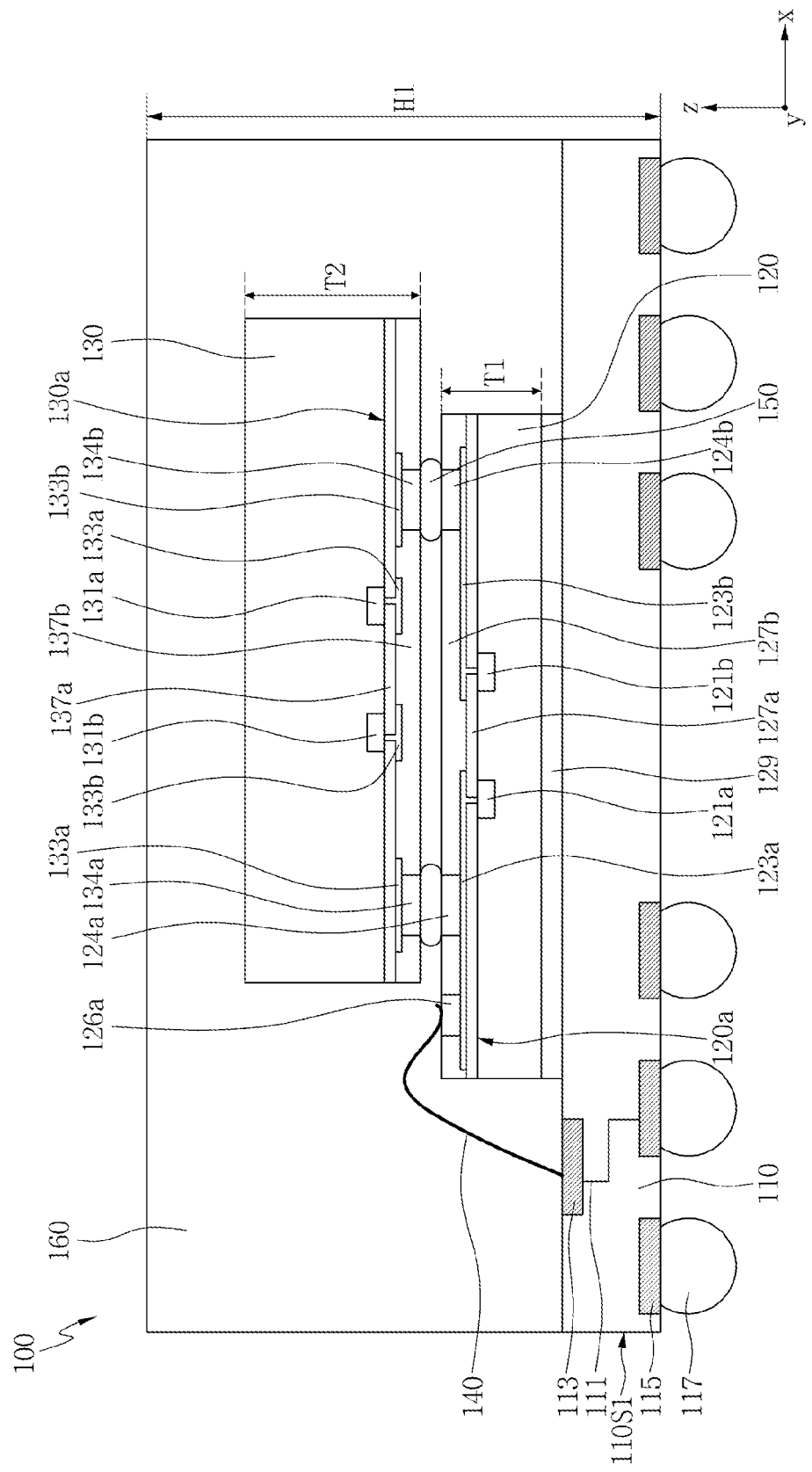

FIG. 1 is a schematic top view showing an exemplary semiconductor package 100. The exemplary semiconductor package 100 includes a lower semiconductor chip 120 mounted on a package substrate 110, and an upper semiconductor chip 130. The upper semiconductor chip 130 may be stacked on the lower semiconductor chip 120 in a cascade shape. FIG. 1 includes a reference line, I, which is referred to in the discussion of FIGS. 3A and 3B. That is, FIGS. 3A and 3B depict a cross-section of the semiconductor package 100 along the reference line, I-I'.

The package substrate 110 may include substrate wire pads 113 arranged close to a first side 110S1. The lower semiconductor chip 120 may include chip wire pads 126 disposed in an outer area close to the first side 110S1 of the package substrate 110 and a first side 120S1 of the lower semiconductor chip 120. The chip wire pads 126 may include first chip wire pads 126a and second chip wire pads 126b, which are alternately arranged. The first and second chip wire pads 126a and 126b may be exposed without being covered by the upper semiconductor chip 130. The semiconductor package may include wires 140 which electrically connect the substrate wire pads 113 and the chip wire pads 126. The package substrate 110 may include a rigid printed circuit board, a flexible printed circuit board, or a rigid-flexible printed circuit board. The package substrate 110 may include a single-layer printed circuit board or a multi-layer printed circuit board.

Figure 2:
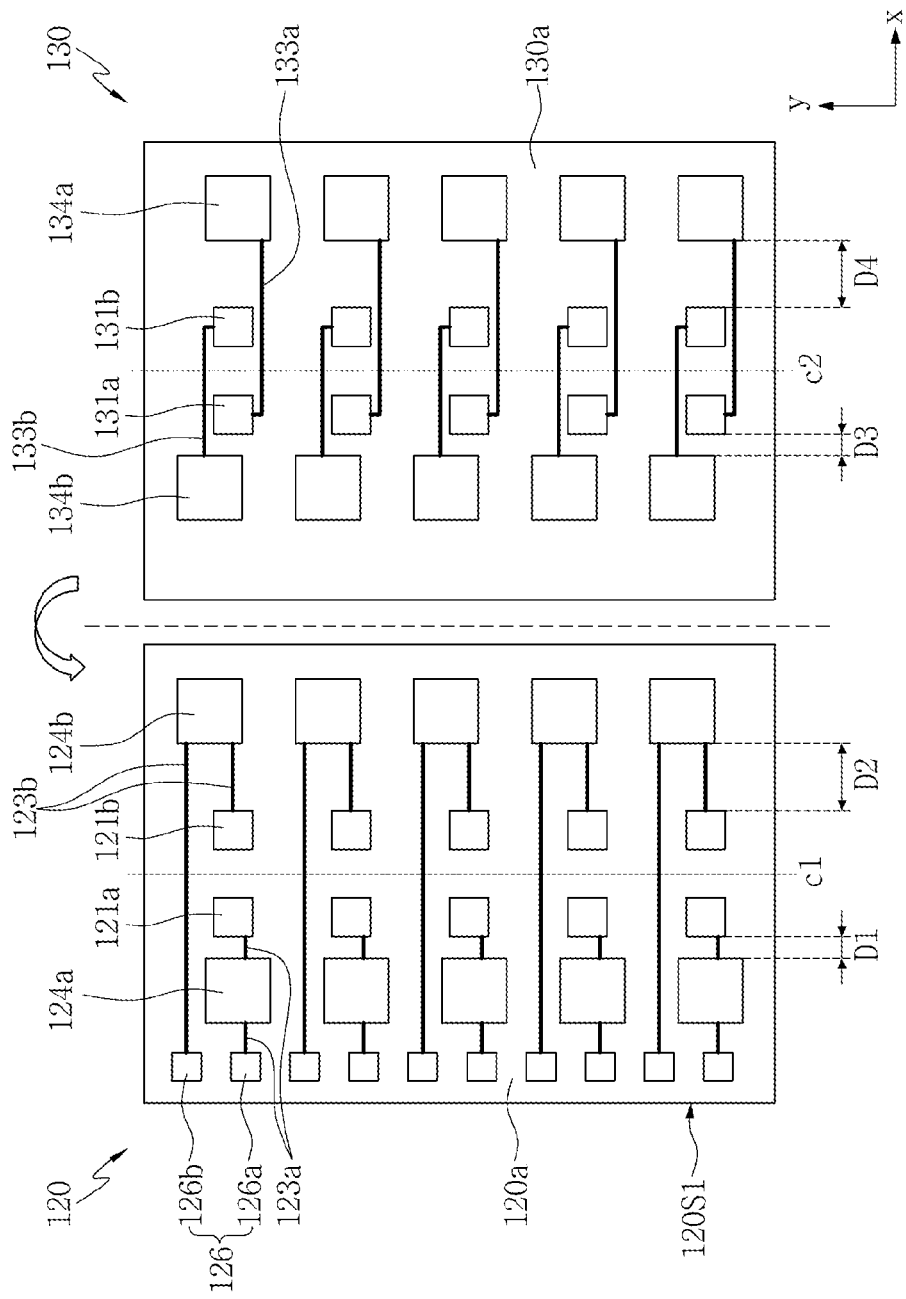
FIG. 2 is a schematic top view showing active surfaces of a lower semiconductor chip and an upper semiconductor chip of FIG. 1.

FIG. 2 is a top view showing active surfaces 120a and 130a of the lower semiconductor chip 120 and the upper semiconductor chip 130 of FIG. 1.

Referring to FIG. 2, the lower semiconductor chip 120 may include first lower chip input/output pads 121a, second lower chip input/output pads 121b, first lower redistribution layers 123a, second lower redistribution layers 123b, first lower bumps 124a, second lower bumps 124b, first chip wire pads 126a, and second chip wire pads 126b, on the active surface 120a. The upper semiconductor chip 130 may include first upper chip input/output pads 131a, second upper chip input/output pads 131b, first upper redistribution layers 133a, second upper redistribution layers 133b, first upper bumps 134a, and second upper bumps 134b, on the active surface 130a.

The first and second lower chip input/output pads 121a and 121b may be arranged in a central area on the active surface 120a of the lower semiconductor chip 120 in two columns. For example, the first lower chip input/output pads 121a may be arranged on a left side of a virtual vertical central line, c1, (which bisects the active surface 120a in a y-direction and may be considered as forming a single column) and the second lower chip input/output pads 121b which may be arranged on a right side of the virtual vertical central line c1 (and may also be considered as forming a single column).

The first and second lower redistribution layers 123a and 123b may be disposed on the first and second lower chip input/output pads 121a and 121b. The first lower redistribution layers 123a may electrically connect the first lower chip input/output pads 121a to the first chip wire pads 126a, and the second lower redistribution layers 123b may electrically connect the second lower chip input/output pads 121b to the second chip wire pads 126b. The first lower redistribution layers 123a may extend, for example, in a −x-direction, for example, as a straight line, but other geometries may be used. The second lower redistribution layers 123b may extend, for example, in a +x direction, in a +y direction, and in a −x direction. The second lower redistribution layers 123b are shown as extending in a bent shape such as double L's or double elbows, but other geometries may be used.

The first and second lower bumps 124a and 124b, and the first and second chip wire pads 126a and 126b may be disposed on the first and second lower redistribution layers 123a and 123b. The first lower bumps 124a may be disposed on the first lower redistribution layers 123a of a straight line shape, and the second lower bumps 124b may be disposed between or on bent parts of the second lower redistribution layers 123b. The first lower bumps 124a may be vertically arranged in a central area of an area to the left of the virtual vertical central line, c1, in a line, and the second lower bumps 124b may be vertically arranged in an end area of an area to the right of the virtual vertical central line, c1, for example, in an area close to a side, in a line. The first lower bumps 124a may be located in a −x direction with respect to the first lower chip input/output pads 121a, and the second lower bumps 124b may be located in a +x direction with respect to the second lower chip input/output pads 121b, on the active surface 120a of the lower semiconductor chip 120.

The first and second lower chip input/output pads 121a and 121b may be arranged in a symmetrical shape with respect to the virtual vertical central line, c1. The first and second lower bumps 124a and 124b may be arranged in an asymmetrical shape with respect to the virtual vertical central line, c1.

The first and second chip wire pads 126a and 126b may be alternately arranged close to the first side 120S1 of the lower semiconductor chip 120. The first side 120S1 of the lower semiconductor chip 120 may be disposed close to the first side 110S1 of the package substrate 110.

The first and second upper chip input/output pads 131a and 131b may be arranged in a central area on the active surface 130a of the upper semiconductor chip 130 in two columns. For example, the first upper chip input/output pads 131a may be arranged on a left side of virtual vertical central line, c2, (which bisects the active surface 130a) and may form a single column, and the second upper chip input/output pads 131b may be arranged on a right side of the virtual vertical central line, c2, and may form a single column. The first lower chip input/output pads 121a and the first upper chip input/output pads 131a, and the second lower chip input/output pads 121b and the second upper chip input/output pads 131b may be arranged at the same locations, respectively. For example, the first lower chip input/output pads 121a and the first upper chip input/output pads 131a, and the second lower chip input/output pads 121b and the second upper chip input/output pads 131b may not be mirrored and may overlap, respectively.

The first upper redistribution layers 133a may electrically connect the first upper chip input/output pads 131a to the first upper bumps 134a, and the second upper redistribution layers 133b may electrically connect the second upper chip input/output pads 131b to the second upper bumps 134b. The first upper redistribution layers 133a may extend, for example, in the +x direction, in a straight line shape, and the second upper redistribution layers 133b may extend, for example, in the −x direction, in a straight line shape.

The first upper bumps 134a may be vertically arranged in an area close to a side of an area to the right of the virtual vertical central line, c2, in a line, and the second upper bumps 134b may be vertically arranged in a central area of an area to the left of the virtual vertical central line, c2, in a line. The first upper bumps 134a may be located in a +x direction with respect to the first upper chip input/output pads 131a, and the second upper bumps 134b may be located in a −x direction with respect to the second upper chip input/output pads 131b, on the active surface 130a of the upper semiconductor chip 130. The first lower bumps 124a and the first upper bumps 134a, and the second lower bumps 124b and the second upper bumps 134b may be mirrored and may overlap, respectively.

The lower semiconductor chip 120 and the upper semiconductor chip 130 may be stacked in a cascade structure in which the active surfaces 120a and 130a are facing each other, so that the first lower bumps 124a and the first upper bumps 134a overlap to face, and the second lower bumps 124b and the second upper bumps 134b overlap to face.

FIGS. 3A and 3B are schematic longitudinal sectional views showing the semiconductor packages taken along the reference line I-I' of FIG. 1.

Referring to FIG. 3A, the semiconductor package in accordance with the embodiment of the inventive concept may include a lower semiconductor chip 120 mounted on a package substrate 110, an upper semiconductor chip 130 bonded in a flip chip bonding method in a cascade shape on the lower semiconductor chip 120, so that active surfaces 120a and 130a are facing, and an encapsulant 160 which covers the lower semiconductor chip 120 and the upper semiconductor chip 130. The encapsulant 160 may include a polymer resin such as an epoxy molding compound. A variety of forms of encapsulant 160 may be used.

The package substrate 110 may include an internal wiring 111, a substrate wire pad 113, and external connection pads 115. The substrate wire pad 113 may be disposed close to a first side 110S1 on an upper surface of the package substrate 110, and the external connection pads 115 may be entirely disposed on a lower surface of the package substrate 110. The internal wiring 111 may be formed inside the package substrate 110 so that the substrate wire pad 113 and the external connection pad 115 are electrically connected. The internal wiring 111, the substrate wire pad 113, and the external connection pads 115 each may include a metal such as copper (Cu), nickel (Ni), or aluminum (Al). Other materials may be used alone or in combination, as deemed appropriate.

The semiconductor package may further include external connection terminals 117 under the external connection pads 115 on the lower surface of the package substrate 110. The external connection terminals 117 each may include a solder ball, a solder bump, a pin grid array, a lead grid array, a conductive tab, or a combination thereof.

The lower semiconductor chip 120 and the upper semiconductor chip 130 each may include a memory chip such as a dynamic random access memory (DRAM) or a flash memory. The lower semiconductor chip 120 may include first lower chip input/output pads 121a, second lower chip input/output pads 121b, first lower redistribution layers 123a, second lower redistribution layers 123b, first lower bumps 124a, second lower bumps 124b, first chip wire pads 126a, and second chip wire pads 126b, on the active surface 120a. The second chip wire pads 126b may be understood with reference to FIGS. 1 and 2.

The lower semiconductor chip 120 may further include a first lower chip insulating layer 127a which partially exposes upper surfaces of the first and second lower chip input/output pads 121a and 121b, on the active surface 120a, and a second lower chip insulating layer 127b which partially exposes upper surfaces of the first and second lower redistribution layers 123a and 123b, on the first lower chip insulating layer 127a. The first lower chip insulating layer 127a and the second lower chip insulating layer 127b each may include one of silicon oxide, silicon nitride, and a polyimide.

The first and second lower redistribution layers 123a and 123b may be formed on the first lower chip insulating layer 127a to be electrically connected to the first and second lower chip input/output pads 121a and 121b, respectively.

The second lower chip insulating layer 127b may cover the upper surfaces of the first and second lower redistribution layers 123a and 123b, and surround side surfaces of the first and second lower bumps 124a and 124b and the first and second chip wire pads 126a and 126b.

An adhesive layer 129 may be disposed between a lower surface of the lower semiconductor chip 120 and the upper surface of the package substrate 110. The adhesive layer 129 may include a non-conductive adhesive material.

The upper semiconductor chip 130 may include first upper chip input/output pads 131a, second upper chip input/output pads 131b, first upper redistribution layers 133a, second upper redistribution layers 133b, first upper bumps 134a, and second upper bumps 134b, on the active surface 130a. The upper semiconductor chip 130 may further include a first upper chip insulating layer 137a which partially exposes lower surfaces of the first and second upper chip input/output pads 131a and 131b, on the active surface 130a, and a second upper chip insulating layer 137b which partially exposes lower surfaces of the first and second upper redistribution layers 133a and 133b, under the first upper chip insulating layer 137a. The first upper chip insulating layer 137a and the second upper chip insulating layer 137b each may include one of silicon oxide, silicon nitride, and a polyimide. Other materials suited for use in the insulating layer 137a may be used.

The first and second upper rewirings 133a and 133b may be formed under the first upper chip insulating layer 137a to be electrically connected to the first and second upper chip input/output pads 131a and 131b, respectively.

The second upper chip insulating layer 137b may cover the lower surfaces of the first and second upper redistribution layers 133a and 133b, and surround side surfaces of the first and second upper bumps 134a and 134b.

The semiconductor package may further include wires 140. The substrate wire pad 113 on the package substrate 110 and the first and second chip wire pads 126a and 126b on the lower semiconductor chip 120 may be bonded in a wire bonding method through the wires 140 to be electrically connected.

The semiconductor package may further include chip connection terminals 150 which electrically connect the lower semiconductor chip 120 to the upper semiconductor chip 130. The first and second lower bumps 124a and 124b and the first and second upper bumps 134a and 134b may be bonded in a flip chip bonding method using the chip connection terminals 150, respectively. The upper semiconductor chip 130 may be stacked on the lower semiconductor chip 120 in a cascade shape so that the active surfaces 120a and 130a are facing each other. Therefore, the first lower bump 124a and the first upper bump 134a may be vertically aligned and may overlap, and the second lower bump 124b and the second upper bump 134b may be vertically aligned and may overlap. The first lower chip input/output pads 121a and the first upper chip input/output pads 131a, and the second lower chip input/output pads 121b and the second upper chip input/output pads 131b may not be vertically aligned and may overlap.

In some embodiments of the semiconductor package 100, the chip wire pads 126 formed on a side of an upper surface of the lower semiconductor chip 120 may be exposed. For example, this may result from the arrangement where the upper semiconductor chip 130 is bonded on the lower semiconductor chip 120 in a cascade structure in a flip chip bonding method. Thus, since the wires 140 bonded to the chip wire pads 126 of the lower semiconductor chip 120 and substrate wire pads 113 of the package substrate 110 are not located between the lower semiconductor chip 120 and the upper semiconductor chip 130, a distance between the lower semiconductor chip 120 and the upper semiconductor chip 130 may be reduced.

Further, as described above, since a thickness of the upper semiconductor chip 130 may be increased due to the reduced distance between the lower semiconductor chip 120 and the upper semiconductor chip 130, damage resulting from warpage on the upper semiconductor chip 130 may be prevented when the upper semiconductor chip 130 is bonded on the lower semiconductor chip 120 in a flip chip bonding method.

Further, as described above, as the damage resulting from warpage on the upper semiconductor chip 130 is prevented, non-wet failure of solder resulting from warpage is substantially eliminated or suppressed. Thus, reliability of bonding between the lower semiconductor chip 120 and the upper semiconductor chip 130 is improved.

Referring to FIG. 3B, in exemplary embodiment of the semiconductor package 100, a thickness, T2, of the upper semiconductor chip 130 may be about the same as a thickness, T1, of the lower semiconductor chip 120. Comparison may be made to the relative scale shown in FIG. 3A. Thus, since a total height, H2, of the semiconductor package 100 may be less than a total height, H1, of the semiconductor package 100 as shown in FIG. 3A, a total size of the semiconductor package 100 may be reduced.

Figure 4:
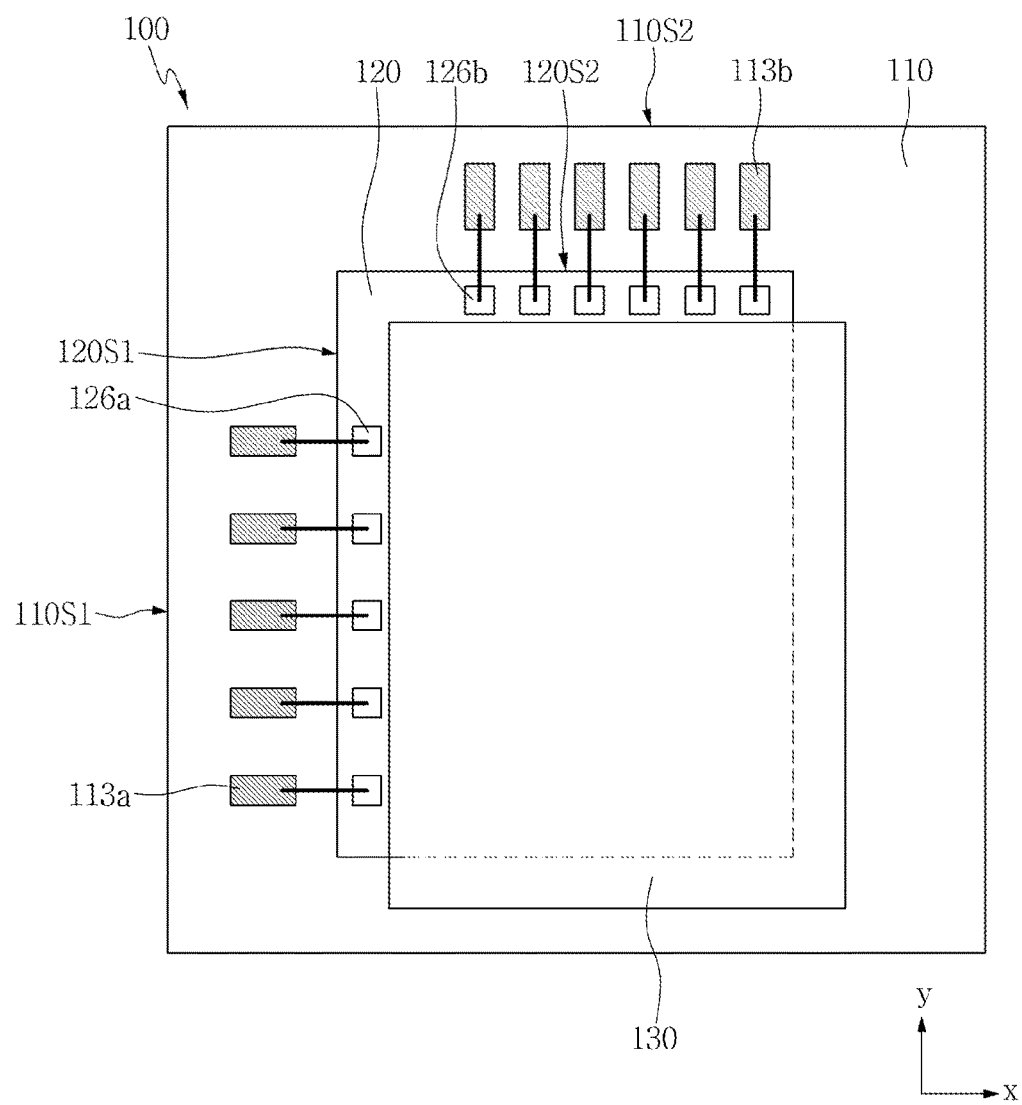
FIG. 4 is a schematic top view showing a semiconductor package in accordance with another embodiment.

FIG. 4 is a schematic top view showing another exemplary embodiment of the semiconductor package 100.

Referring to FIG. 4, the semiconductor package 100 may include the lower semiconductor chip 120 and the upper semiconductor chip 130, both of which are mounted on the package substrate 110. The upper semiconductor chip 130 may be stacked on the lower semiconductor chip 120 in a cascade shape of two directions.

The package substrate 110 may include first substrate wire pads 113a and second substrate wire pads 113b on an upper surface thereof. For example, the first substrate wire pads 113a may be disposed close to a first side 110S1 of the package substrate 110, and the second substrate wire pads 113b may be disposed close to a second side 110S2 perpendicular to the first side 110S1.

The lower semiconductor chip 120 may include first chip wire pads 126a disposed in an outer area close to the first side 120S1 of the lower semiconductor chip 120, which is disposed close to the first side 110S1 of the package substrate 110, and second chip wire pads 126b disposed in an outer area close to the second side 120S2 of the lower semiconductor chip 120, which is disposed close to the second side 110S2 of the package substrate 110.

The upper semiconductor chip 130 may be stacked on the lower semiconductor chip 120 in an x-direction and a y-direction, respectively, in a "cascade shape" so that the first and second chip wire pads 126a and 126b are exposed.

As shown in particular with regards to FIGS. 3A and 3B, as well as FIG. 4, the "cascade shape" may refer to a relationship where a respective side of the upper semiconductor chip 130 is at least slightly offset from a correlating respective side of the lower semiconductor chip 120. In the example shown in FIGS. 3A and 3B, this offset is in the x-direction. In the example shown in FIG. 4, the offset is in the x-direction and the y-direction (that is, the offset applies to two sides of the upper semiconductor chip 130 in relation to two sides of the lower semiconductor chip 120).

Figure 5:
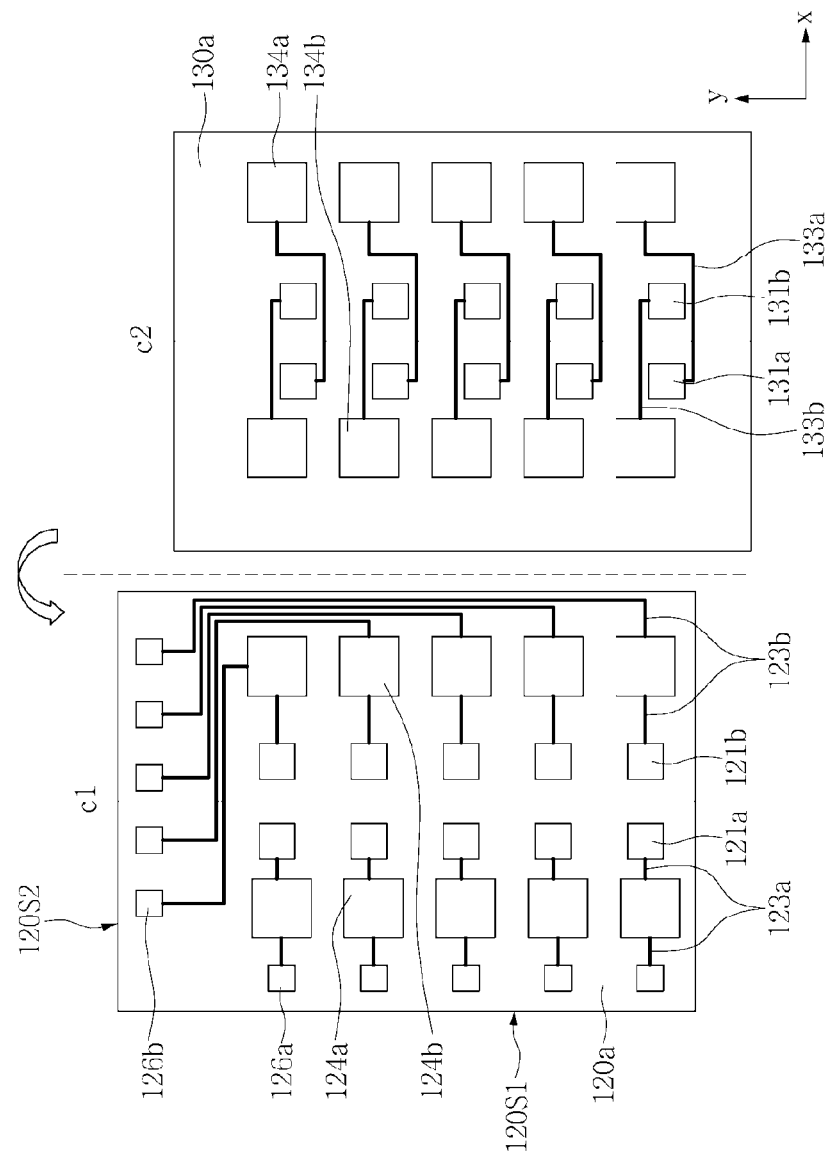
FIG. 5 is a schematic top view showing active surfaces of a lower semiconductor chip and an upper semiconductor chip of the semiconductor package of FIG. 4.

FIG. 5 is a schematic top view showing the active surfaces 120a and 130a of the lower semiconductor chip 120 and the upper semiconductor chip 130 of the semiconductor package 100 of FIG. 4.

Referring to FIG. 5, in the lower semiconductor chip 120, the first chip wire pads 126a may be arranged close to the first side 120S1 of the lower semiconductor chip 120, and the second chip wire pads 126b may be arranged close to the second side 120S2 of the lower semiconductor chip 120, compared to that of FIG. 2. The first side 120S1 of the lower semiconductor chip 120 may be disposed close to the first side 110S1 of the package substrate 110, and the second side 120S2 of the lower semiconductor chip 120 may be disposed close to the second side 110S2 of the package substrate 110.

FIGS. 6, 7, 8 and 9 are views for describing a method of manufacturing the semiconductor package 100.

Figure 6:
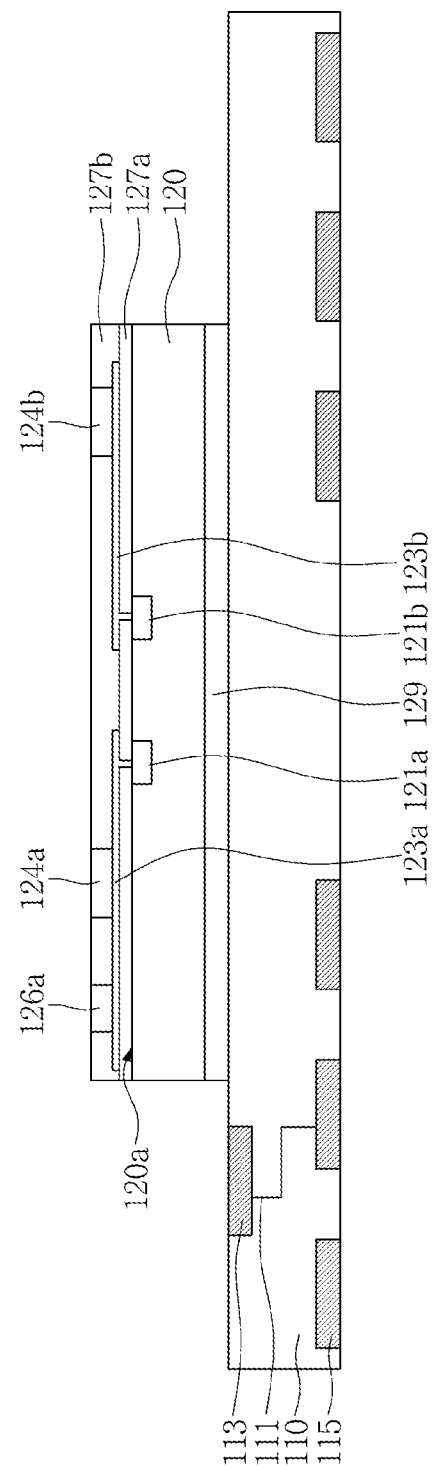
FIGS. 6, 7, 8 and 9 are views for describing a method of manufacturing the semiconductor package.

Referring to FIG. 6, the method of manufacturing the semiconductor package 100 may include preparing the package substrate 110 and mounting the lower semiconductor chip 120 on the upper surface of the package substrate 110. An adhesive layer 129 may be formed between the upper surface of the package substrate 110 and the lower surface of the lower semiconductor chip 120. The package substrate 110 may include the substrate wire pad 113 disposed on the upper surface thereof, the external connection pads 115 disposed on the lower surface thereof, and the internal wiring 111 formed thereinside to electrically connect the substrate wire pad 113 to the external connection pad 115. The lower semiconductor chip 120 may include the first lower chip input/output pads 121a and the second lower chip input/output pads 121b, which are disposed on the active surface 120a, the active surface 120a which partially exposes the upper surfaces of the first and second lower chip input/output pads 121a and 121b, the first lower chip insulating layer 127a disposed on the first and second lower chip input/output pads 121a and 121b, the first lower redistribution layers 123a and the second lower redistribution layers 123b, which are disposed on the first lower chip insulating layer 127a, the first lower bumps 124a, the second lower bumps 124b, the first chip wire pads 126a, and the second chip wire pads 126b, which are disposed on the first and second lower redistribution layers 123a and 123b, and the second lower chip insulating layer 127b which surrounds the upper surfaces of the first and second lower redistribution layers 123a and 123b and side surfaces of the first and second lower bumps 124a and 124b and the first and second chip wire pads 126a and 126b. The first lower chip insulating layer 127a and the second lower chip insulating layer 127b each may include one of silicon oxide, silicon nitride, and a polyimide.

Figure 7:
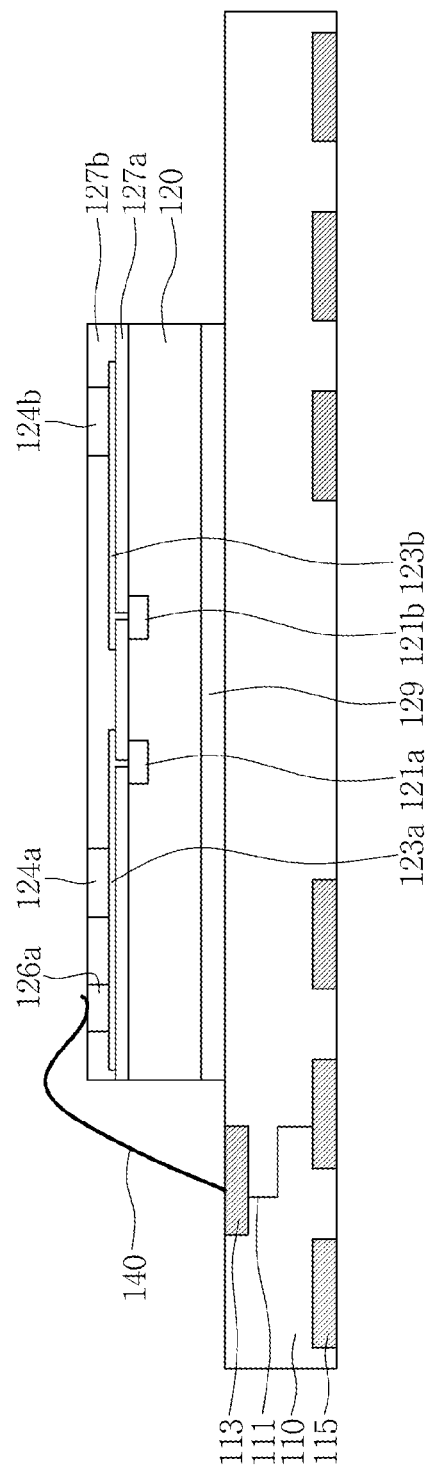

Referring to FIG. 7, the method may include electrically connecting the substrate wire pads 113 of the package substrate 110 to the chip wire pads 126 of the lower semiconductor chip 120 using the wires 140.

Figure 8:
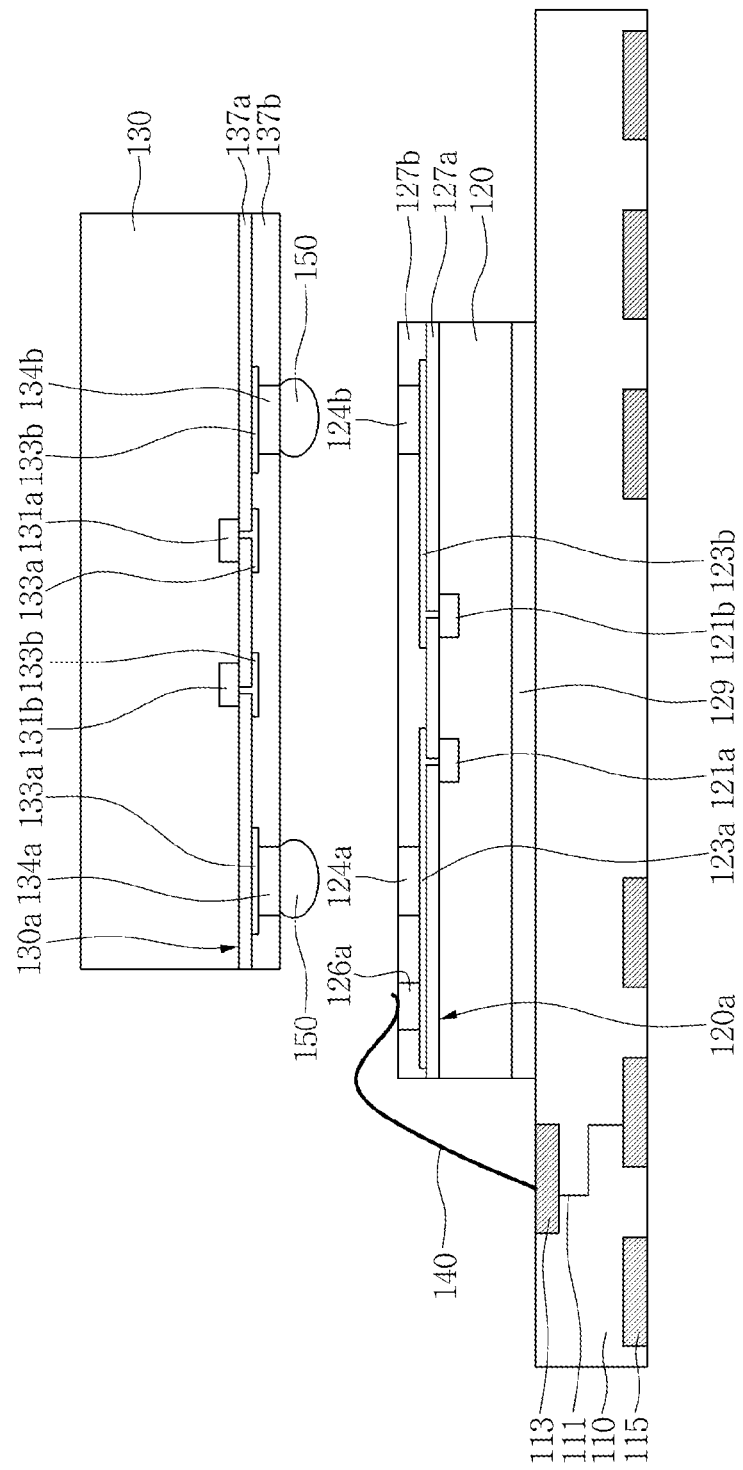

Referring to FIG. 8, the method may include aligning the upper semiconductor chip 130 on the lower semiconductor chip 120. The active surface 120a of the lower semiconductor chip 120 and the active surface 130a of the upper semiconductor chip 130 may be aligned in a cascade shape to face. The upper semiconductor chip 130 may include the first upper chip input/output pads 131a and the second upper chip input/output pads 131b, which are disposed on the active surface 130a, the first upper chip insulating layer 137a disposed under the active surface 130a and the first and second upper chip input/output pads 131a and 131b, which partially exposes the upper surfaces of the first and second upper chip input/output pads 131a and 131b, the first upper redistribution layers 133a and the second upper redistribution layers 133b, which are disposed under the first upper chip insulating layer 137a, the first upper bumps 134a and the second upper bumps 134b, which are disposed under the first and second upper redistribution layers 133a and 133b, and the second upper chip insulating layer 137b which surrounds the upper surfaces of the first and second upper rewirings 133a and 133b and side surfaces of the first and second upper bumps 134a and 134b. The first upper chip insulating layer 137a and the second upper chip insulating layer 137b each may include one of silicon oxide, silicon nitride, and a polyimide.

The first and second lower bumps 124a and 124b of the lower semiconductor chip 120 may be vertically aligned with and may overlap the first and second upper bumps 134a and 134b of the upper semiconductor chip 130, respectively. The conductive chip connection terminals 150 may be formed under the first and second upper bumps 134a and 134b of the upper semiconductor chip 130.

Figure 9:
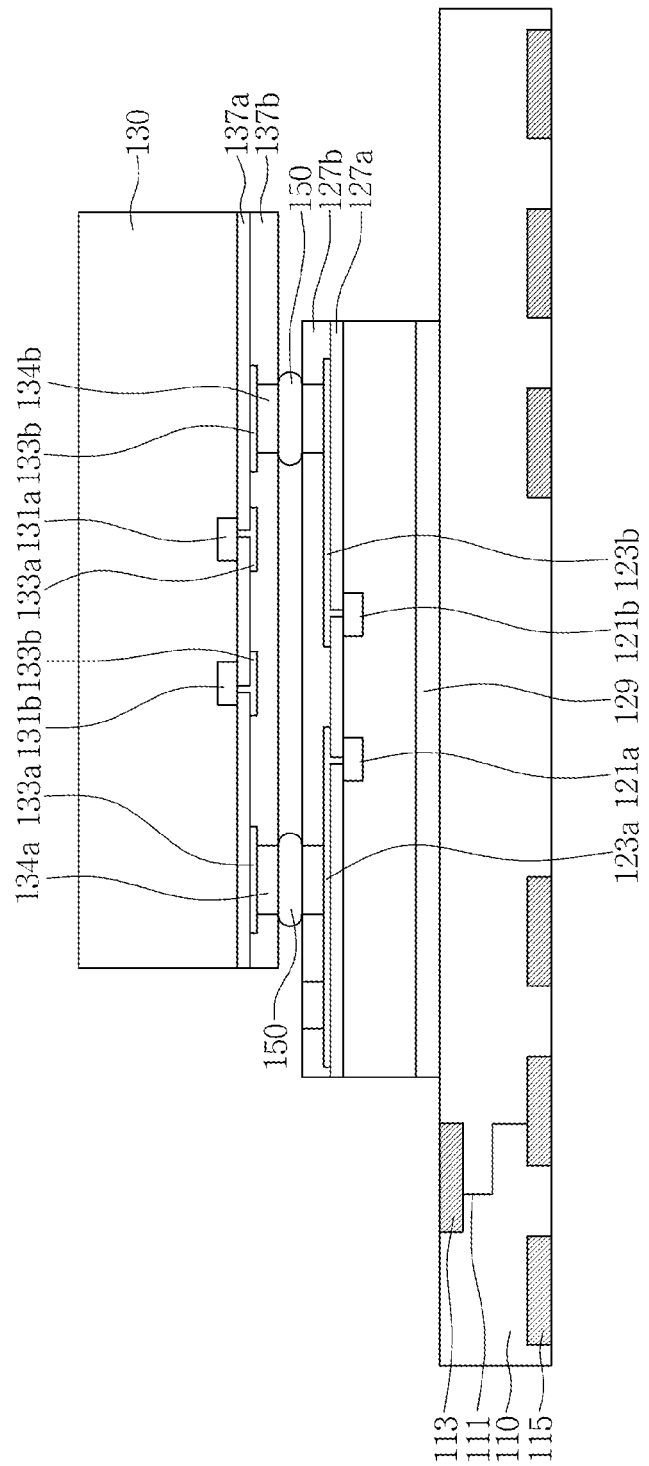

Referring to FIG. 9, the method may include bonding the lower semiconductor chip 120 and the upper semiconductor chip 130 in a flip chip bonding method. For example, the bonding of the lower semiconductor chip 120 and the upper semiconductor chip 130 may include bonding the first and second lower bumps 124a and 124b, and the first and second upper bumps 134a and 134b using the chip connection terminals 150 so that the active surfaces 120a and 130a are facing.

Referring again to FIG. 3, the method may include forming the encapsulant 160 which covers the lower semiconductor chip 120 and the upper semiconductor chip 130 on the package substrate 110, and forming the external connection terminals 117 under the external connection pads 115 formed on the lower surface of the package substrate 110.

Figure 10:
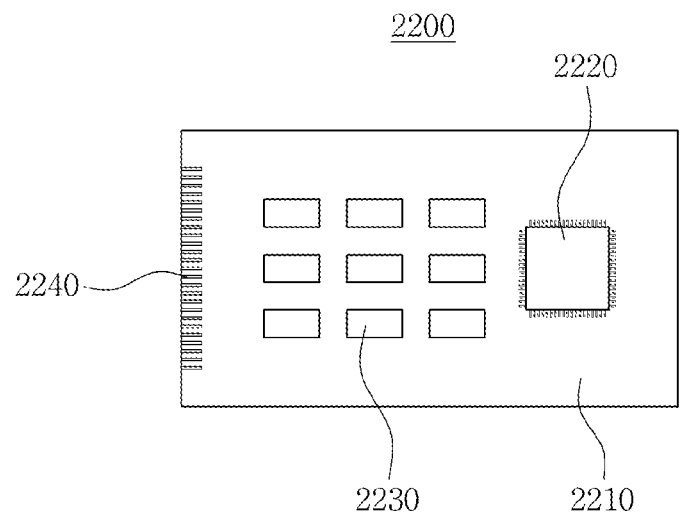
FIGS. 10, 11, 12 and 13 are views conceptually showing a module, electronic systems, and a mobile wireless phone, respectively, to which the semiconductor packages are applied.

FIG. 10 is a view conceptually showing an exemplary module 2200 that includes embodiments of the semiconductor package 100. The exemplary module 2200 may include semiconductor devices 2230 mounted on a module substrate 2210. The semiconductor devices 2230 may include semiconductor package stack structures as presented herein. The module 2200 may further include a microprocessor 2220 mounted on the module substrate 2210. Input/output terminals 2240 may be disposed on at least one side of the module substrate 2210. The semiconductor devices 2230 may be mounted on the module substrate 2210 using a flip chip technique.

Figure 11:
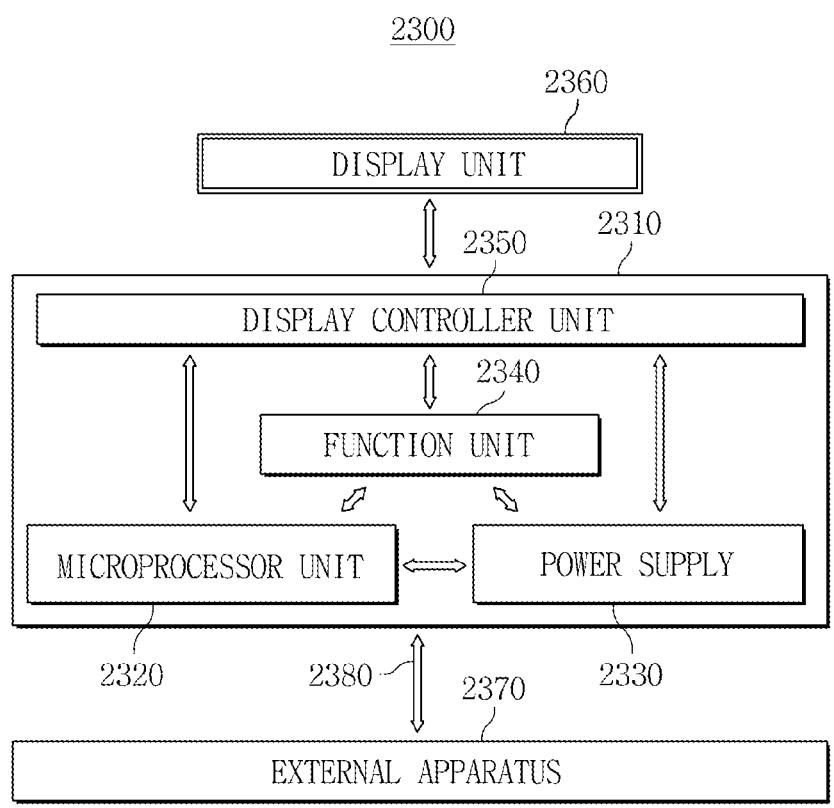

FIG. 11 is a system block diagram for describing an electronic system 2300 that makes use of semiconductor packages as disclosed herein.

Referring to FIG. 11, the semiconductor packages 100 may be applied to the electronic system 2300. The electronic system 2300 may include a body 2310, a microprocessor unit 2320, a power supply 2330, a function unit 2340, and a display controller unit 2350. The body 2310 may include a mother board formed by a printed circuit board (PCB). The microprocessor unit 2320, the power supply 2330, the function unit 2340, and the display controller unit 2350 may be mounted on the body 2310. A display unit 2360 may be disposed inside or outside the body 2310. For example, the display unit 2360 may be disposed on a surface of the body 2310 and may display an image processed by the display controller unit 2350.

The power supply 2330 may receive a constant voltage from an external battery (not shown), divide the voltage into various voltage levels, and supply the voltages to the microprocessor unit 2320, the function unit 2340, the display controller unit 2350, etc. The microprocessor unit 2320 may receive a voltage from the power supply 2330 to control the function unit 2340 and the display unit 2360. The function unit 2340 may perform various functions of the electronic system 2300. For example, when the electronic system 2300 is a smart phone, the function unit 2340 may include dialing, or various components to perform wireless communication functions such as video output to the display unit 2360 or voice output to a speaker through communication with an external apparatus 2370, and when a camera is included, the function unit 2340 may serve as a camera image processor.

In an application embodiment, when the electronic system 2300 is connected to a memory card to expand the capacity, the function unit 2340 may be a memory card controller. The function unit 2340 may exchange signals with the external apparatus 2370 through a wired or wireless communication unit 2380. Further, when the electronic system 2300 requires a Universal Serial Bus (USB) to expand the functions, the function unit 2340 may serve as an interface controller. In addition, the function unit 2340 may include a mass storage device. The semiconductor packages 100 that are included may be applied to the function unit 2340, the microprocessor unit 2320, or otherwise used as deemed appropriate.

Figure 12:
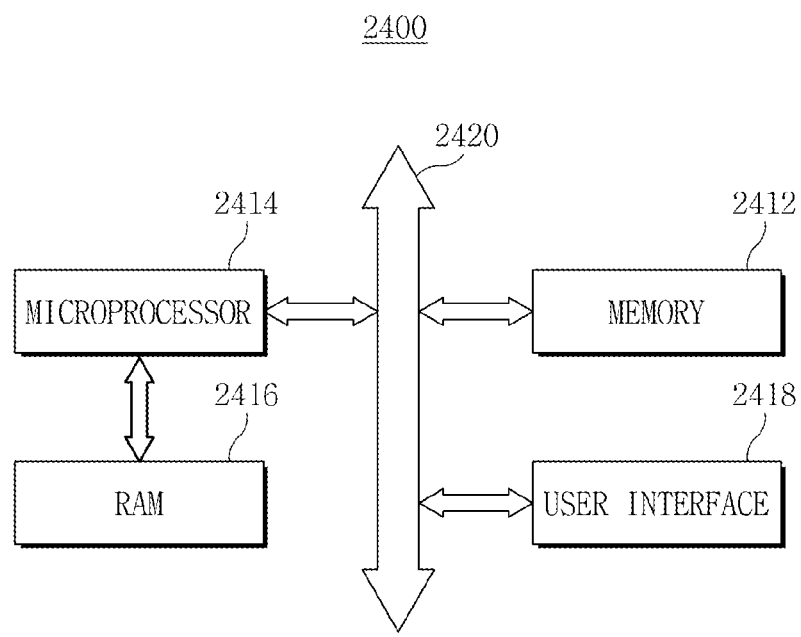

FIG. 12 is a block diagram for describing another electronic system 2400 including at least one of the semiconductor packages 100.

Referring to FIG. 12, the electronic system 2400 may include at least one of the semiconductor packages 100 as disclosed herein. The electronic system 2400 may be used to manufacture a mobile device or a computer. For example, the electronic system 2400 may include a memory 2412, a microprocessor 2414, a RAM 2416, and a user interface 2418. The microprocessor 2414 may program and control the electronic system 2400. The RAM 2416 may be used as an operational memory of the microprocessor 2414. The microprocessor 2414, the RAM 2416, and/or other components may be assembled within a single package. The memory 2412 may store operational codes of the microprocessor 2414, data processed by the microprocessor 2414, or data received from the outside. The memory 2412 may include a controller and a memory.

The semiconductor packages 100 may be applied to the microprocessor 2414, the RAM 2416, the memory 2412, or as otherwise deems appropriate.

Figure 13:
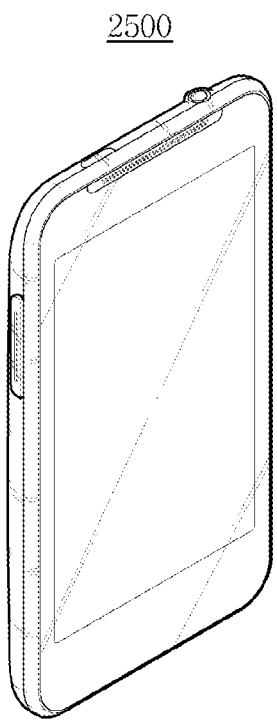

FIG. 13 is a schematic view showing a mobile wireless phone 2500 including at least one of the semiconductor packages 100 as disclosed herein. The mobile wireless phone 2500 may be understood as a tablet PC. Furthermore, at least one of the semiconductor packages 100 may be used in a portable computer such as a notebook PC, an MPEG audio layer-3 (MP3) player, an MP4 player, a navigation device, a solid state disk (SSD), a desktop computer, an automobile, and a household appliance, in addition to the tablet PC.

According to the semiconductor package 100, since the upper semiconductor chip 130 is bonded on the lower semiconductor chip 120 in a flip chip bonding method in a cascade structure, chip wire pads 126 formed on a side of an upper surface of the lower semiconductor chip 120 are exposed, and thus, wires bonded to the chip wire pads 126 are not located between the lower semiconductor chip 120 and the upper semiconductor chip 130. Therefore, a distance between the lower semiconductor chip 120 and the upper semiconductor chip 130 can be reduced.

Further, as described above, a thickness of the upper semiconductor chip 130 may be increased due to the reduced distance between the lower semiconductor chip 120 and the upper semiconductor chip 130. Thus, damage resulting from warpage on the upper semiconductor chip 130 can be prevented when the upper semiconductor chip 130 is bonded on the lower semiconductor chip 120 in a flip chip bonding method.

Further, as described above, as warpage on the upper semiconductor chip 130 is prevented, a non-wet failure of solder resulting from warpage is suppressed. Thus reliability of bonding between the lower semiconductor chip 120 and the upper semiconductor chip 130 can be improved.

Other effects, advantages and various aspects have been described in the above detailed specification.

In addition, names and functions of components in which reference numerals thereof are not in the drawings or only the reference numerals are illustrated will be easily understood from other drawings and descriptions in this specification.

Although a few embodiments have been described, those skilled in the art will readily appreciate that many modifications are possible in embodiments without materially departing from the novel teachings and advantages. Therefore, it is to be understood that the foregoing is illustrative of various embodiments and is not to be construed as limited to the specific embodiments disclosed.

What is claimed is:

1. A semiconductor package, comprising:
a package substrate including a first substrate wire pad;
a lower semiconductor chip mounted on the package substrate, wherein the lower semiconductor chip comprises a first lower chip input/output pad, a first lower redistribution layer, a first lower bump, and a first chip wire pad, which are electrically connected; and
an upper semiconductor chip stacked on the lower semiconductor chip in a cascade shape,
wherein an active surface of the lower semiconductor chip is facing an active surface of the upper semiconductor chip, and
wherein the first lower chip input/output pad is disposed in a central area on an active surface of the lower semiconductor chip, the first chip wire pad is disposed in a first outer area of the lower semiconductor chip closer to a first side on the active surface of the lower semiconductor chip, the first lower bump is disposed between the first lower chip input/output pad and the first chip wire pad, and the first lower redistribution layer electrically connects the first lower chip input/output pad, the first lower bump, and the first chip wire pad to each other.

2. The package of claim 1, wherein the lower semiconductor chip comprises:
a second lower chip input/output pad in a central area of the active surface of the lower semiconductor chip;
a second lower redistribution layer, wherein the first lower redistribution layer and the second lower redistribution layer are disposed on the first lower chip input/output pad and the second lower chip input/output pad , respectively; and
a second lower bump and a second chip wire pad, wherein the first lower bump and the second lower bump are disposed on the first lower redistribution layer and the second lower redistribution layer, respectively, and the first chip wire pad and the second chip wire pad disposed on the first lower redistribution layer and the second lower redistribution layer, respectively.

3. The package of claim 2, wherein the package substrate comprises a first substrate wire pad disposed on the package substrate to be closer to a first side of the package substrate closer to the first side of the lower semiconductor chip.

4. The package of claim 3, wherein the second chip wire pad is disposed closer to a second side of the lower semiconductor chip perpendicular to the first side of the lower semiconductor chip.

5. The package of claim 4, wherein the package substrate comprises a second substrate wire pad disposed closer to a second side of the package substrate perpendicular to the first side of the package substrate, on the package substrate.

6. The package of claim 3, wherein the first chip wire pad and the first substrate wire pad are bonded in a wire bonding method using wires.

7. The package of claim 2, wherein the upper semiconductor chip comprises:
a first upper chip input/output pad and a second upper chip input/output pad in a central area of the active surface;
a first upper redistribution layer and a second upper redistribution layers on the first upper chip input/output pad and the second upper chip input/output pad, respectively; and a first upper bump and a second upper bump on the first upper redistribution layer and the second upper redistribution layer, respectively.

8. The package of claim 7, wherein the first lower bump is vertically aligned and overlaps with the first upper bump and the second lower bump is vertically aligned and overlaps with the second upper bump.

9. The package of claim 8, wherein the first lower bump is flip chip bonded to the first upper bump using chip connection terminals, and the second lower bump is flip chip bonded to the second upper bump using chip connection terminals.

10. The package of claim 2, wherein the first and second chip wire pad is exposed without being covered by the upper semiconductor chip.

11. The package of claim 1, wherein the cascade shape comprises an offset of at least one side of the upper semiconductor chip from a respective side of the lower semiconductor chip.

12. A semiconductor package, comprising:
a package substrate including a first substrate wire pad;
a lower semiconductor chip mounted on the package substrate, wherein the lower semiconductor chip comprises a first lower chip input/output pad, a first lower redistribution layer, a first lower bump, and a first chip wire pad, which are electrically connected; and
an upper semiconductor chip stacked on the lower semiconductor chip in a cascade shape, wherein the upper semiconductor chip comprises a first upper chip input/output pad, a first upper redistribution layer, and a first upper bump, which are electrically connected,
wherein the first chip wire pad of the lower semiconductor chip is exposed without being covered by the upper semiconductor chip, the first chip wire pad of the lower semiconductor chip is bonded to the first substrate wire pad of the package substrate in a wire bonding method, and the first lower bump of the lower semiconductor chip is bonded to the first upper bump of the upper semiconductor chip in a flip chip bonding method, and
wherein the first lower chip input/output pad is disposed in a central area on an active surface of the lower semiconductor chip, the first chip wire pad is disposed in a first outer area of the lower semiconductor chip closer to a first side on the active surface of the lower semiconductor chip, the first lower bump is disposed between the first lower chip input/output pad and the first chip wire pad, and the first lower redistribution layer electrically connects the first lower chip input/output pad, the first lower bump, and the first chip wire pad to each other.

13. The package of claim 12, wherein the lower semiconductor chip further comprises:
a second lower chip input/output pad disposed in the central area on the active surface of the lower semiconductor chip;
a second chip wire pad disposed in a second outer area of the lower semiconductor chip closer to a second side perpendicular to the first side on the active surface of the lower semiconductor chip;
a second lower bump disposed between the second lower chip input/output pad and the second chip wire pad; and
a second lower redistribution layer configured to electrically connect the second lower chip input/output pad, the second lower bump, and the second chip wire pad to each other,
wherein the second chip wire pad is exposed without being covered by the upper semiconductor chip.

14. The package of claim 12, wherein the first upper chip input/output pad is disposed in a central area on an active surface of the upper semiconductor chip, the first upper bump is disposed in a first outer area on the active surface of the upper semiconductor chip, which overlaps the first outer area of the lower semiconductor chip, and the first upper redistribution layer electrically connects the first upper chip input/output pad to the first upper bump.

15. The package of claim 14, wherein the upper semiconductor chip further comprises:
a second upper chip input/output pad in the central area on the active surface of the upper semiconductor chip;
a second upper bump disposed in a second outer area on the active surface of the upper semiconductor chip, which overlaps an outer area opposite to the first outer area of the lower semiconductor chip; and
a second upper redistribution layer configured to electrically connect the second upper chip input/output pad to the second upper bump.

* * * * *